United States Patent [19]

Swart

[11] Patent Number: 5,252,916

[45] Date of Patent: Oct. 12, 1993

[54] PNEUMATIC TEST FIXTURE WITH SPRINGLESS TEST PROBES

[75] Inventor: Mark A. Swart, Upland, Calif.

[73] Assignee: Everett Charles Technologies, Inc., Pomona, Calif.

[21] Appl. No.: 827,023

[22] Filed: Jan. 27, 1992

[51] Int. Cl.[5] ...................... G01R 1/073; G01R 31/02
[52] U.S. Cl. ............... 324/158 P; 324/158 F
[58] Field of Search ............... 324/158 F, 158 P, 72.5; 439/197

[56] References Cited

U.S. PATENT DOCUMENTS

| | | | |
|---|---|---|---|
| 3,016,489 | 1/1962 | Briggs et al. | 324/158 R |
| 3,714,572 | 1/1973 | Ham et al. | 324/158 P |
| 4,061,969 | 12/1977 | Dean | 324/158 F |
| 4,115,735 | 9/1978 | Stanford | 324/158 P |
| 4,232,928 | 11/1980 | Wickersham | 324/158 P |
| 4,340,858 | 7/1982 | Malloy | 324/158 P |
| 4,963,821 | 10/1990 | Janko et al. | 324/158 P |
| 4,968,931 | 11/1990 | Littlebury et al. | 324/158 P |

*Primary Examiner*—Ernest F. Karlsen
*Attorney, Agent, or Firm*—Christie, Parker & Hale

[57] ABSTRACT

A fluid actuated test fixture with springless contacts for use in the automatic testing of printed circuit boards is connected to an electronic circuit tester for performing high-speed testing of circuits on the board. The fixture includes a housing, an inner chamber formed by covering the opening of an air chamber housing with an elastomeric diaphragm, a support plate with a flex circuit laminated along one side, and an array of solid (springless) test probes disposed in the support plate for access to a surface of the circuit board. When the circuit board to be tested is placed on the fixture, a vacuum drawn between the circuit board and support plate urges the circuit board to contact the test probes. When the pressure within the inner chamber is increased, the probes move into the diaphragm to stretch the diaphragm and the diaphragm applies a resilient spring-like counterforce against the test probes in unison, which transfers the spring force to the test points on the board under test. A set of electrical test signals is communicated from the test probes through printed circuits on the flex circuit and through an array of interface pins connected to the circuit traces on the flex circuit.

26 Claims, 5 Drawing Sheets

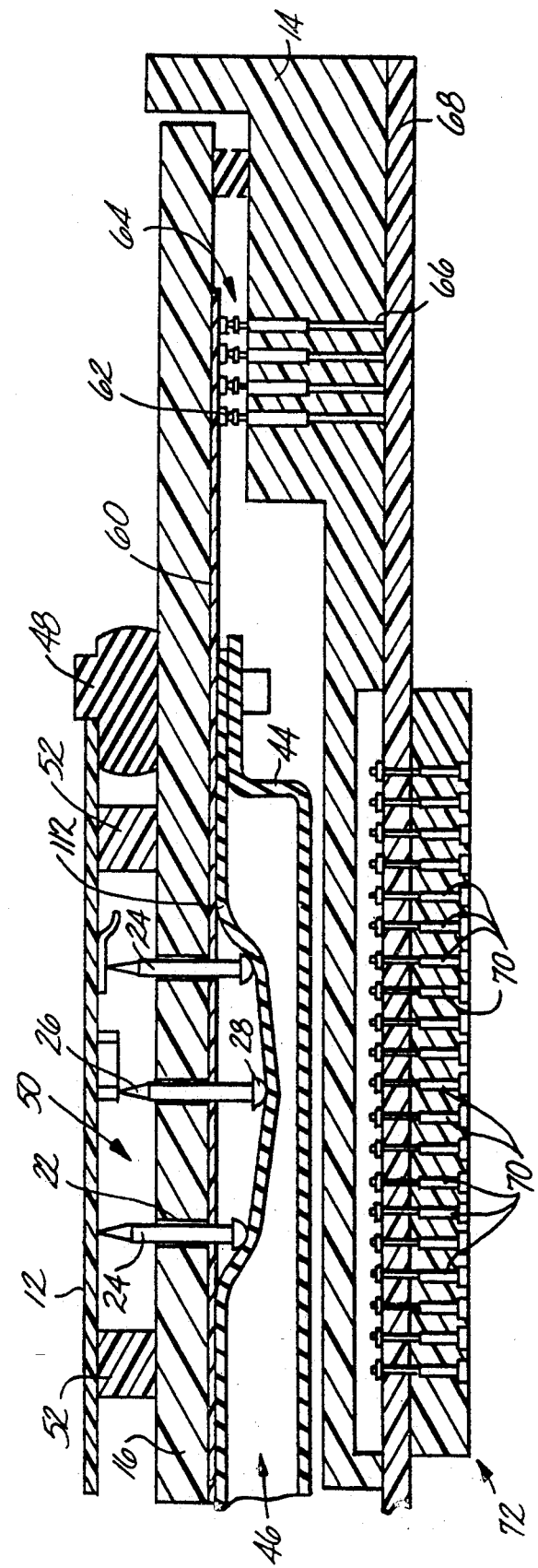

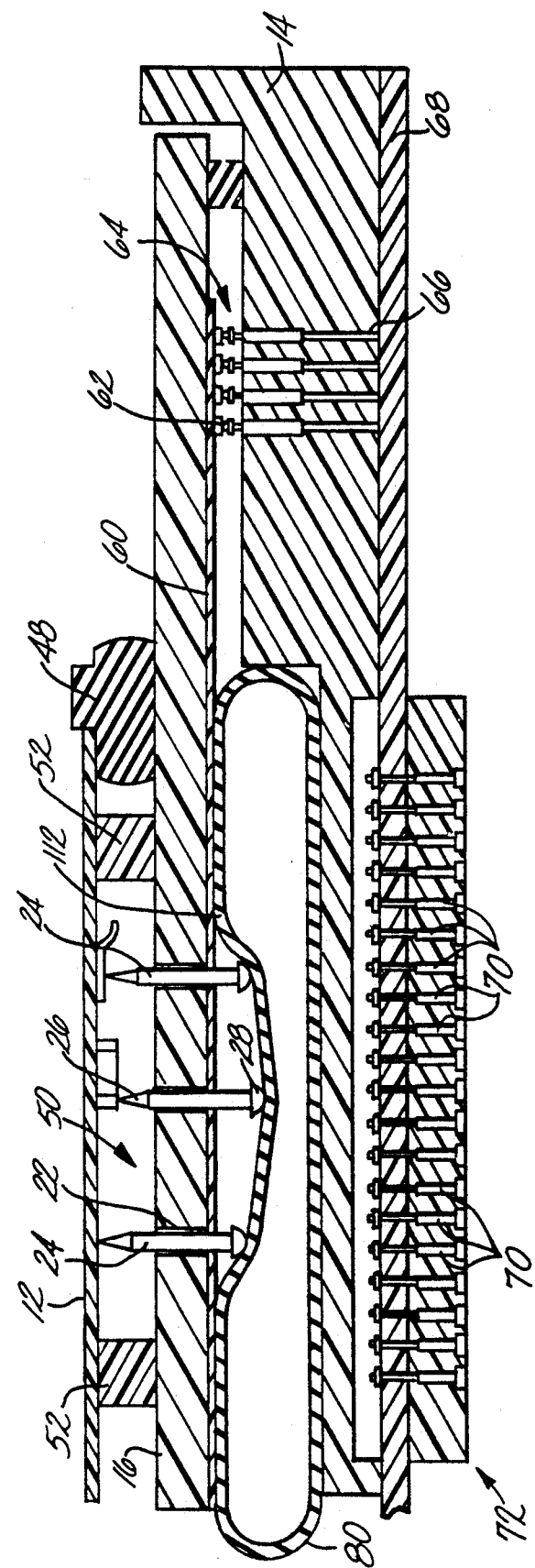

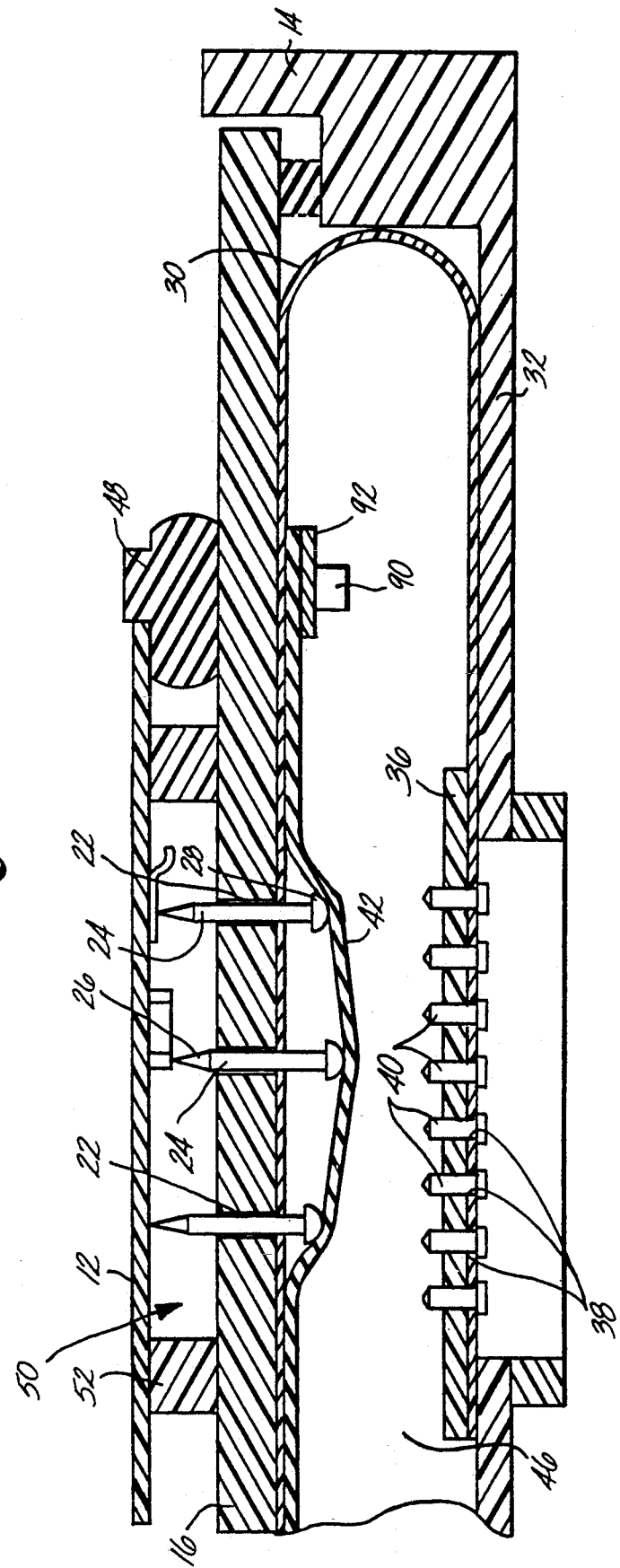

PNEUMATIC TEST FIXTURE WITH SPRINGLESS TEST PROBES

FIELD OF THE INVENTION

This invention relates to the automatic testing of printed circuit boards, and more particularly, to a vacuum test fixture having an elastic diaphragm for applying a spring force against test probes.

BACKGROUND OF THE INVENTION

Automatic test equipment for checking printed circuit boards has long involved use of a "bed of nails" test fixture to which the circuit board is mounted during testing. This test fixture includes a large number of nail-like spring loaded test probes arranged to make electrical contact under spring pressure with designated test points on the circuit board under test. Any particular circuit laid out on a printed circuit board is likely to be different from other circuits and consequently, the "bed of nails" arrangement for contacting test points in a particular circuit board must be customized for that circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture, superimposed on the array of test probes. During testing, spring loaded test probes are brought into spring pressure contact with the test points on the circuit board under test. Electrical test signals are then transferred from the board to the test probes and then to the exterior of the fixture for communication with a high-speed electronic test analyzer which detects continuity, or lack of continuity, between various test points in the circuits on the board.

Various fixtures have been used in the past for bringing the test probes and the circuit board under test into pressure contact for testing. One class of these fixtures is a wired test fixture in which the test probes are individually wired to separate interface contacts for use in transmitting test signals from the probes to the external electronically controlled test analyzer. These wired test fixtures are often referred to as vacuum test fixtures since a vacuum is applied to the interior of the test fixture housing during testing to compress the circuit board into contact with the test probes. In one type of vacuum test fixture, an upper probe plate supports the board under test and the test probes are mounted in a fixed lower probe plate. Holes are drilled in the upper probe plate to match the pattern of test points, and the test probes pass through the holes for contact with the underside of the board under test. During testing, a vacuum applied to the region between the upper and lower probe plates moves the upper probe plate toward the lower probe plate, which compresses the circuit board into contact with the test probes. This applies spring pressure from the probes to the test points on the board.

Various approaches have been used in the past for arranging the test probes in a pattern corresponding to the test points on the circuit board. A first approach called a grid type arrangement has an array of test probes placed in fixed locations independent of the circuit board under test. Rows of test points are electrically connected to the electronic test analyzer by printed circuit boards or wire harnessing. Rows of test probes are evenly spaced apart in a grid pattern. The test probes are aligned to corresponding test points on the circuit board using a panel containing holes that redirect the test probes to the closest test point. Thus, the basic grid-type fixture remains independent of the circuit board to be tested and is adapted to each circuit board by means of this panel. However, because the number of probes is independent of the number of test points needed, extensive wiring both within the test fixture and to the test electronics is required. Because extensive wiring is complex and costly, the major cost of this method of fixturing is in the grid fixture. Conversely, adapting this type of fixture to individual circuit boards is relatively inexpensive because the only change required is the addition of the panel with a hole pattern corresponding to the circuit board under test.

A second approach for arranging test probes uses the moving probe plate with test probes inserted in holes drilled in a pattern corresponding to the test points on the circuit board under test, as described above. This type of test fixture typically includes an electrical interconnect from the test probes to an interface connector for communicating the electrical test signals from the test probes to the electronic test analyzer. Under this approach, a unique test panel is required for each unique circuit board to be tested. In these custom type testers, fixturing is generally more complex than in the grid type fixtures, but with a custom system, the interfaces and test electronics are less complex and costly. It is the customized wired test fixtures to which the present invention is generally directed. The resulting cost advantages and fixturing make this type of test system more economical than the grid type system.

Various test probes have been used in the past. In one class of such probes, each probe contains a spring for applying a spring force against the test points. The typical spring probe comprises a tubular housing with a closed end and a compression spring inside the housing which bears against the closed end of the housing. The other end of the spring bears against the inner end of a movable plunger in the housing. When the spring is extended its desired length, the plunger engages a stop on the housing. During testing, the spring is compressed to apply a controlled spring force against the plunger so that a tip of the plunger applies a spring force to a test point on the circuit board. The tip of the plunger must be sufficiently small to achieve good electrical contact with the test point while avoiding contact with adjacent test points or circuit traces on the board. Similarly, the housing of each test probe must be small enough to not interfere with adjacent test probes, while maintaining the structural integrity of the test panel that holds the test probes.

As circuit board technology advances, circuit components are more closely spaced. The test points and probes for such circuits necessarily must be more closely spaced, requiring smaller probe and springs, which become more difficult and expensive to make.

In another class of test probes used in the prior art, such as shown in U.S. Pat. No. 4,340,858 to Malloy, each probe comprises an elongated solid metal pin mounted in a channel molded in a support panel. A circuit board closes the channels that hold the conductive pins. Electrical contact between the pins and circuits on the circuit board is achieved using individual spring clips which apply pressure to the moving pins. Longitudinal displacement of the pin in each channel is resisted by a compliant mat mounted in the base of the test fixture to engage ends of the pins. As the circuit board under test presses against the test probes, the compliant mat is compressed. Each pin thereby receives an opposite spring force to hold the pins against the board under test.

With this type of test probe, various compliant mats with different elastic properties must be used when different spring forces are required. Furthermore, for a given compressible mat, the spring force of the test probe against the circuit board is different for test probes with different displacements because the spring force provided by the mat varies with the distance of compression. For example, a test probe contacting a component on the circuit board will displace the compressible mat more than a test probe contacting a test point of the board. Thus, the spring force against the component is greater than the force against the test point. This can be troublesome for many types of components. Another disadvantage of the compressible mat is that it sometimes acquires a "set" after repeated use, which produces undesirable variations in the spring forces applied by the mat to the probes.

Some prior art pneumatic test fixtures apply a fluid pressure against one end of a test probe. Such a fixture is disclosed in U.S. Pat. No. 3,714,572 to Ham, et al., for example. The spring force applied by the test probe is limited by the transverse cross sectional area of the end of the probe. As test probes become smaller in diameter for higher density circuit boards, this test fixture applies less force to each probe.

A prior art test fixture using a flexible diaphragm is disclosed in U.S. Pat. No. 3,016,489 to Briggs. In Briggs '489, an electronic circuit card is mounted on rigid mounting channels for clamping the circuit card in place. Test probes are mounted opposite the circuit card in a metal assembly plate. The test probes have Teflon pegs that contact a flexible diaphragm at one end of the test probes. When the circuit card is mounted on the fixture, the probes engage the card and are pushed down against the flexible diaphragm. Hydraulic pressure is applied on one side of the flexible diaphragm to force the test probes into contact with the circuit card during testing. A metal cap is mounted at the end of each probe to contact the circuit card under test. A lead is soldered to an external test circuit terminal and soldered to the metallic conducting cap. For high density circuit boards that contain several thousand test points, the individual wiring of the leads to each probe can be time consuming, unreliable and costly. Furthermore, as test probes get smaller, as discussed above, the construction of test probes with multiple parts becomes increasingly more difficult and costly. The test procedure thus involves placing each board on the fixture by forcing it into pressure contact against the elastic resistance force of the diaphragm, removing the board after test and repeating the procedure for the next board. This procedure is not adaptable to the testing of boards rapidly and where the boards have high density test points.

A second prior art test fixture using a flexible diaphragm is disclosed in U.S. Pat. No. 4,232,928 to Wickersham. In Wickersham '928, test probes that contact the printed circuit board are connected to corresponding contact pins by wire wrap connections. The contact structures engage interface pins in a manner similar to that of the test probes. The pins are interconnected by wire wrap connections to wires for communicating test signals to the test electronics. A flexible diaphragm is spaced apart below a guide plate that holds the test probes and the contact pins. During testing the diaphragm engages the contact pins and the test probes and urges them into contact with the interface pins and the circuit board, respectively. The circuit board is mounted against a yieldable electrically nonconductive pad formed of a plastic foam material secured to the bottom of an enclosure. The foam pad applies force against the circuit card to counter the test probes and flex the diaphragm to create spring pressure on the probes. A vacuum applied above the diaphragm or a positive fluid pressure applied below the diaphragm maintains the diaphragm elastic force on the probes. For high density circuit boards that use thousands of test probes, the wire wrap connections between the test probes and the contact pins become time consuming, unreliable and costly. Furthermore, the numerous wired connections between the test probes and the contact pins provide an intertwined group of wires that will resist the spring force of the flexible diaphragm. Thus, for these high density circuit boards the diaphragm may not apply a proper spring force against the test probes and thus a reliable electrical contact between the test probes and the circuit board cannot be ensured. The diaphragm arrangement with respect to the probes and their means of support does not ensure direct uniform force applied by all probes to the board, due to lack of containment of the diaphragm under a pressure difference having more displacement in the center of the diaphragm than at the sides where the diaphragm is fixed.

During initial setup for test, contaminants, such as solder flux or foreign material, or oxidation on test probes or test points may prevent a test probe from achieving a reliable electrical contact with the test point. Some prior art test fixtures require the operator to release the circuit card from the test probes in an attempt to mechanically break the contaminants, electrical barrier. This requires the vacuum in pneumatic fixtures to be released, and, for all fixtures, power to be shut down. Reestablishing the vacuum and restarting power are costly because test time is increased.

SUMMARY OF THE INVENTION

Briefly, this invention provides a circuit board test fixture which applies a substantially uniform force to each of a plurality of electrically conducting probes for testing circuit boards having different physical dimensions and components. The invention uses a combination of solid pins or test probes and a flexible diaphragm for applying spring pressure to the solid pins. The test probes need not have compression springs, or other mechanical spring connections, which facilitates manufacturing probes of reduced dimensions to accommodate higher densities of circuit components or test points. Other improvements are also provided.

In one embodiment of the invention, a circuit board is mounted on a rigid support plate so the board and support plate are spaced apart and are substantially parallel. A plurality of elongated and laterally spaced apart test probes extend through respective bores in the support plate in a pattern corresponding to that of test points on the printed circuit board. The probes are longitudinally movable relative to the support plate. One end of each probe contacts a respective test point on the printed circuit board. The other end of each probe projects from the support plate and away from the circuit board to bear against one side of an elastic diaphragm mounted to be held under tension. The test probes, in one embodiment, are arranged in a two-dimensional array, mutually spaced apart across the surface area of the probe plate, to match the two-dimensional array of test points on the board under test. The elastic diaphragm is held in tension against the array of test probes and against a side of the probe support plate opposite from the board. During testing, the board is drawn toward the support plate and the test probes are moved and forced by the circuit board against the diaphragm, which stretches and applies a resilient spring-like pressure against the array of test probes in unison to force the probes into good electrical contact with test points on the circuit board.

In a preferred form of the invention, a fluid pressure differential is applied across the opposite sides of the elastic diaphragm, which urges the diaphragm into spring pressure contact with the array of test probes for applying pressure from each probe independently to the board under test. In one form of the invention, the fluid pressure differential is produced by a vacuum applied between the board and the diaphragm to draw the board toward and into contact with the test probes and then into pressure contact with the diaphragm to flex the diaphragm so it can apply its opposing spring force to the probes.

In addition to the advantages of using solid pins, as opposed to spring loaded test probes, other improvements are provided by the fixture of this invention. For example, applying a positive fluid pressure to the elastic diaphragm transfers a controlled and reasonably uniform spring force to components or test points on the board under test. In addition, wire wrapping of individual test probes is avoided. As described below, the test fixture is adapted for use with flexible translator circuits, which simplifies the transfer of test signals from the test probes to the external electronic test analyzer.

Preferably, the support plate is made of a solid electrically insulating material. The support plate bores that guide the test probes are preferably metal plated and provide good electrical contact with the test probes, which make a sliding contact with the metal plating in the bores. Preferably, a translator circuit comprised of conductive circuit traces disposed on a flexible insulating sheet is bonded to the support plate. The conductive sleeves in the bores are connected to selected circuit traces on the flex circuit. The translator circuit extends to an electrical interface from which the electrical circuits continue to a test analyzer. The test analyzer applies electrical test signals to selected circuit traces on the flex circuit, which communicate the signals to corresponding test probes to send the test signals through the circuit board for detection by other test probes, which send the test signals to related circuit traces on the flex circuit, and back to the test analyzer.

The flex circuit used in combination with the elastic diaphragm and the solid (springless) test probes provides a high density test fixture with controlled resilient pressure applied by the probes to the test points. A simplified means of transferring test signals from the test probes to the external test analyzer, including avoiding individual wire wrapping of the test probes, is a significant advantage.

These and other aspects of the invention will be more fully understood by referring to the following detailed description and the accompanying drawings.

BRIEF DESCRIPTION OF THE DRAWINGS

FIG. 3 is a semi-schematic cross-sectional view of the pneumatic fixture using interface probes between a probe plate and a signal receiver interface;

FIG. 4 is a semi-schematic cross-sectional view of the pneumatic fixture using an air bladder; and FIG. 5 is a semi-schematic cross-sectional view of the test fixture using a taut elastic diaphragm.

DETAILED DESCRIPTION

Figure 1:
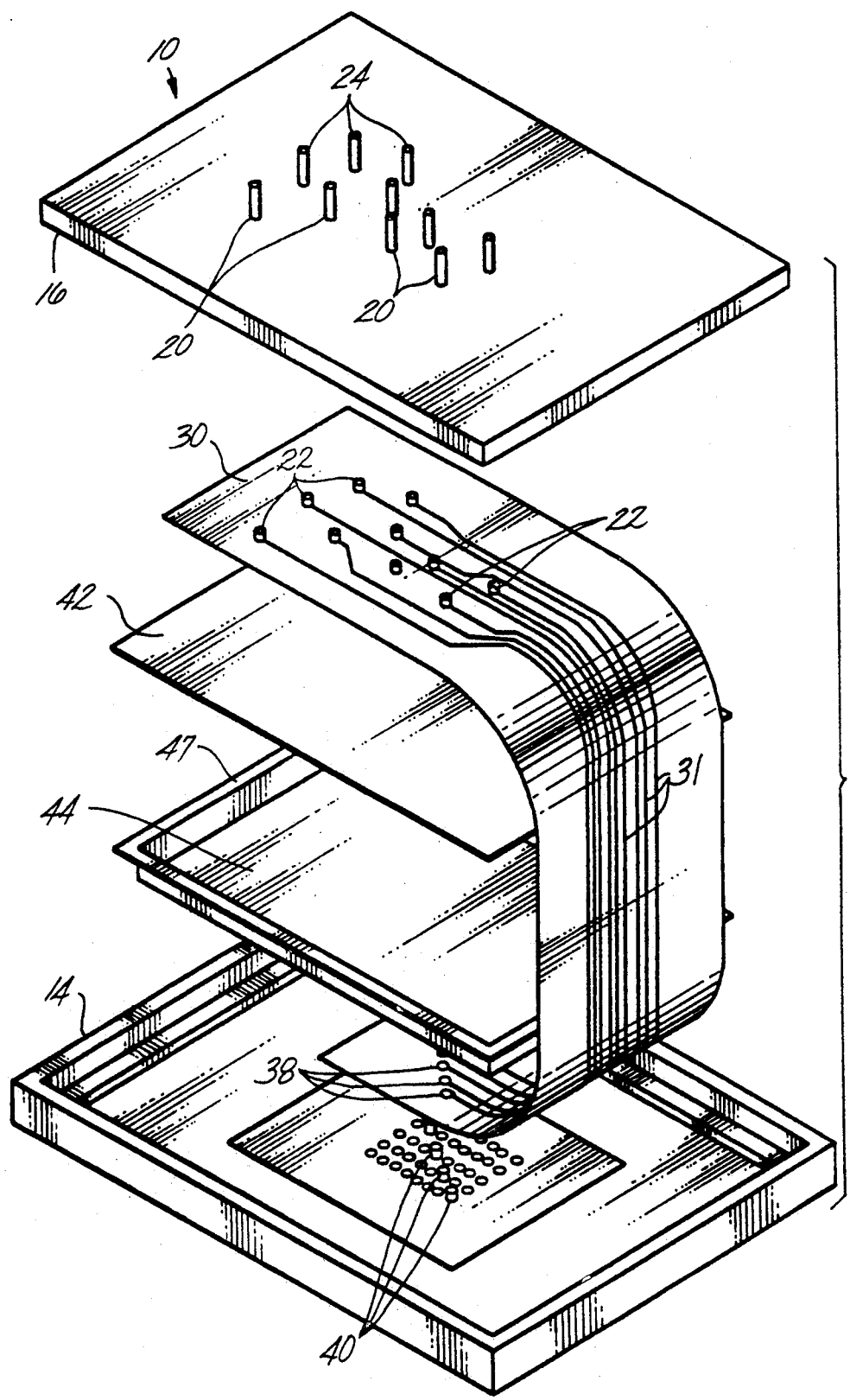
FIG. 1 is an exploded isometric view showing a pneumatic test fixture according to principles of this invention.
Figure 2:
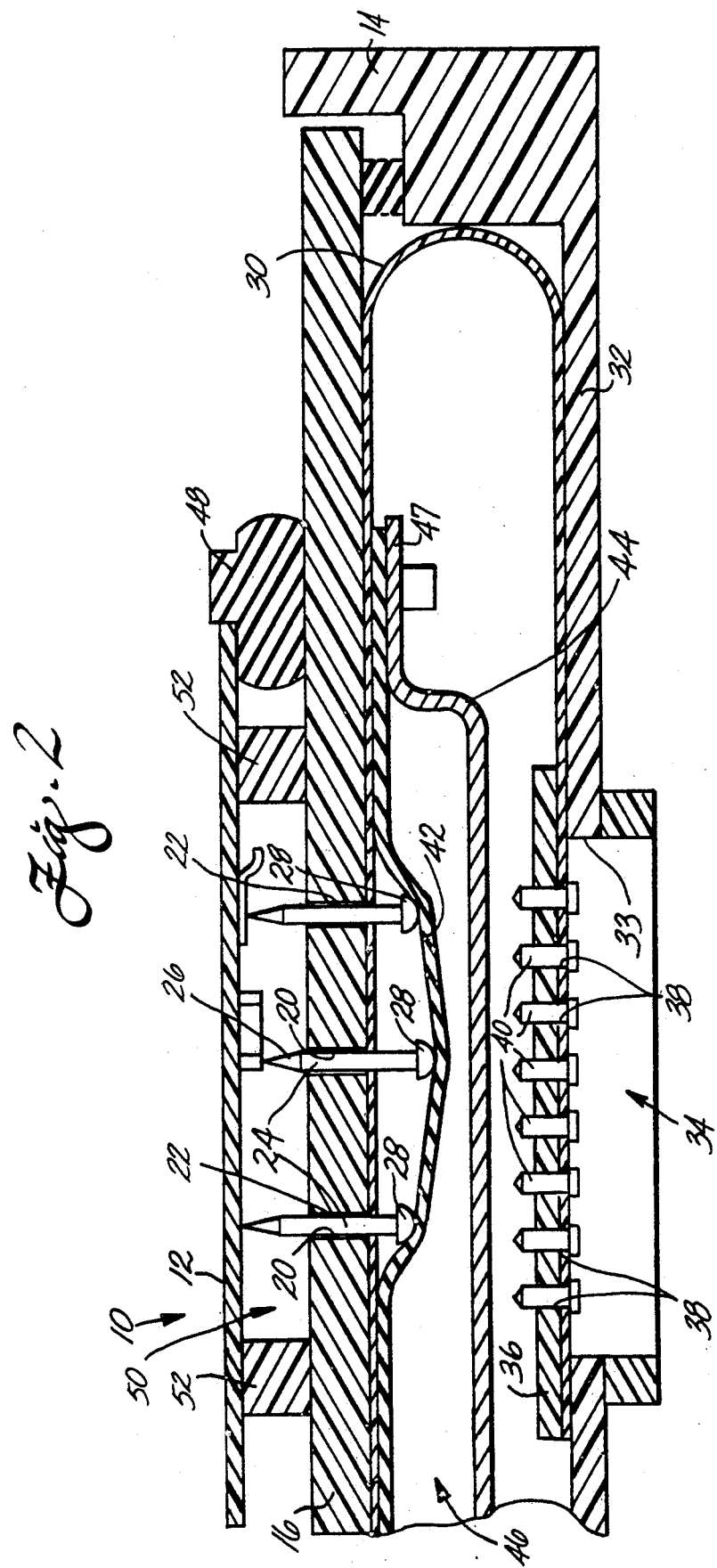
FIG. 2 is a semi-schematic cross-sectional view of the pneumatic fixture assembled for testing.

FIG. 1 and 2 illustrate a fluid actuated fixture 10 for testing a printed circuit board 12. The fluid actuated fixture preferably comprises a pneumatic fixture having a housing 14 in a box-like shape with an open end on the top. The opening of the fixture housing is closed by a support plate 16 which can also be referred to as an upper probe plate. This support plate 16 is made of a sturdy, rigid electrical insulating material, such as G-10 fiberglass. The support plate has a plurality of separate bores 20 drilled through the depth of the plate and opening to both sides of the plate. The bores are drilled in a pattern corresponding to the pattern of the test points on the circuit board 12. This pattern of bores is preferably drilled in a two-dimensional array of holes spaced across the surface area of the support plate.

An electrically conductive barrel 22 (also referred to as an eyelet) is press fitted into each bore 20. Separate test probes 24 are movably mounted in each of the barrels 22. A flex circuit 30 is laminated to a bottom surface of the upper probe plate 16. The flex circuit comprises a flexible sheet of an electrically insulating material which supports a pattern of electrically conductive circuit traces 31 typically made of copper bonded to the flexible sheet. Each barrel 22 has an outer flange that pierces a circuit trace and seats the flange to the circuit trace to form an electrical connection. The test probes are movable axially in their respective barrels freely and under gravity. The test probes slide on the inside of the barrels for making sliding electrical contact. The test probes also have a sharp tip 26 on one end and a round head 28 on the other end. The test probes are preferably solid metal pins. The probes are mounted in the bores so that the sharp tip extends toward the circuit board 12 and the round head faces toward the other side of the support plate 16. (Only a few of the test probes, which can be several thousand in number, are shown for clarity. Components of the fixture and the probes also are shown exaggerated in size or disproportionate in relative size also for clarity.)

The preferred flex circuit sheet material is a thin, self-supporting thermoplastic film such as Mylar. Frequently, many layers of Mylar and copper circuit traces are bonded together thereby forming a multiple layer flex circuit. The flex circuit 30 is freely wrapped downwardly around the inner side of the fixture housing 14 and along a top surface of a fixed bottom plate 32 of the fixture housing. The flex circuit 30 is laminated to the top surface of the bottom plate 32. The flex circuit is laminated to the support plate and to the bottom plate by suitable adhesives or other means of bonding the plastic sheet to the support and bottom plates.

The bottom plate 32 includes an opening 33 for a receiver 34 having a flanged interface for receiving a connector (not shown) of a wire harness (not shown) to a test electronics analyzer (not shown). A portion of the flex circuit 30 which extends across the receiver opening 33 in the bottom plate 32 is bonded to a rigid pin plate 36 to rigidize the flex circuit for assuring a proper alignment of the connector and receiver. The rigidized section of the flex circuit has a plurality of bores 38 in a pattern corresponding to the pattern of the connectors on the harness from the test analyzer. Interface pins 40 are pressed into the bores of the rigidized section of flex circuit and the pins are electrically connected to conductive circuit traces on the flex circuit. The array of interface pins 40 connects to the wire harness from the test analyzer. The interface pins can be arranged in a pattern such as a uniform grid pattern in which the spacing between pins is substantially greater than the more dense spacing between the test probes 20 at the board under test.

A thin, flexible elastomeric diaphragm 42 is placed across the opening of an air chamber housing 44 having a hat-shaped cross-section to form an air chamber 46 below the support plate. The diaphragm is made from an elastically stretchable non-porous material such as natural rubber or a synthetic elastomer such as neoprene rubber. The thin, flexible diaphragm is stretchable longitudinally (in the plane of the rubber sheet) and in a direction perpendicular to the plane of the rubber sheet. The air chamber housing 44 is mounted to the bottom portion of the top plate 18 so that a peripheral flange 47 of the housing sandwiches the periphery of the diaphragm 42 between the flange 47 and the flex circuit at the bottom of the support plate. This forms a continuous air-tight seal around the periphery of the diaphragm. The peripheral seal is preferably arranged to hold the diaphragm in a substantially immovable at-rest position against the fixed planar bottom of the rigid support plate. (The diaphragm is actually held against the face of the flex circuit 30 laminated to the bottom face of the support plate, but the support plate provides the rigid means of support for both the flex circuit and the diaphragm and therefore the diaphragm is considered to be held against the bottom face of the support plate.) The diaphragm has a central region within its peripheral seal that freely overlies the bottom of the support plate and which is normally held in contact with the heads 28 of the test probes 24. The diaphragm is held under tension applied normally within the plane of the diaphragm so that the diaphragm is held taut against the bottom face of the support plate. When the diaphragm is held against the support plate it provides a uniform spring force (in the plane of the diaphragm and depthwise, perpendicular to the face of the diaphragm) across the surface of the diaphragm. Probes moving into the diaphragm to displace it are resisted by an equal and opposite force generated by the flexible diaphragm.

A peripheral gasket 48 on the top surface of the support plate 16 encloses the array of test probes 24. The circuit board 12 is placed on the gasket 48 to form a pressure seal between the circuit board and the top side of the support plate 16. During use, air is drawn from a hollow interior space or volume 50 between the circuit board 12 and the support plate 16, which causes the outside atmospheric pressure to apply a force against the circuit board 12, thereby moving the board in a downward direction. (Although the use of air is being described, other fluids, such as liquid or gas can be used. Air is preferred because additional costs are not incurred for purchasing other fluids nor are fluid leaks a major concern other than for maintaining proper pressures.) The diaphragm is impervious to air and acts as an air-tight seal across the bottom of the support plate. The air space 50 below the sealed board is in gas communication with the diaphragm through the passages in which the probes are mounted. The force applied by the air pressure difference compresses the board against the gasket 48 until the circuit board contacts an array of board stops 52. This travel of the board forces the board to move down into contact with the tips of the test probes and then forces the test probes 24 downwardly in the support plate 16 toward the upper face of the diaphragm. Contact from the moving probes stretches the elastic diaphragm downwardly into the hollow air chamber 46 below the support plate. The tension in the stretched diaphragm resists the downward force of each test probe with an equivalent counter-force. At the same time, air is drawn into the air chamber 46, causing the elastomeric diaphragm 42 to push axially upwardly against the test probes 24 which, in turn, apply a spring-biased force against the bottom of the circuit board 12. As the gas pressure inside the air chamber 46 is increased, the diaphragm applies a progressively greater spring-biased force to the individual test probes. The vacuum is continuously drawn from the interior space 50 during testing of the circuit board.

As an alternative to use of the solid straight linearly travelling probes 24, a "helix probe" can be used in which the probe has a helical groove and a detent is formed in the inside of the barrel to engage the helical groove. Spring pressure is applied through the flexible diaphragm, and the probe twists about its axis as the probe is displaced axially toward the diaphragm.

When the air pressure reaches an equilibrium point where it is not changing during test, the pressure at each point along the surface of the diaphragm is constant. The force applied against each probe by the uniform pressure on the diaphragm is also equal. This force is independent of the displacement of the probe into the diaphragm because the pressure is equal at each point of the diaphragm. The spring rate of the diaphragm is low. The elastic properties of the diaphragm material and the air pressure are the principal factors influencing force on the probes from diaphragm deflection. The distance of probe travel does not have a substantial effect on probe force.

In summary, the support plate 16 is disposed adjacent and substantially parallel to the circuit board for holding the board in a testing position. The array of test probes extend through the support plate in a pattern aligned with the test points on the circuit board. Respective first ends of the test probes contact respective test points on the circuit board and opposite second ends of the test probes project from the support plate and away from the board. The elastic diaphragm is mounted on the support plate so that a first side of the diaphragm can contact the bottom of the support plate and the second ends of the test probes which are normally in the plane of the bottom face of the support plate. The diaphragm is freely movable away from the support plate and is stretchable under the downward pressure of the moving test probes. In its stretched condition the diaphragm is held under tension in spring-biased pressure contact with the second ends of the test probes in unison to force the probes axially and simultaneously against respective test points on the circuit board.

When the test probes 24 initially try to establish electrical contact with the test points on the circuit board 12, contamination, such as solder flux or other foreign matter, oxidation, or other similar material may prevent an adequate electrical connection. By cycling the pressure within the air chamber 46 through high and low pressures, the force of the tip 26 of the test probe 24 against corresponding test point similarly cycles and may pierce the obstruction and thereby achieve electrical contact between the test probe and the test point.

During testing, electrical test signals from the electronic test analyzer are applied to the interface pins 40 in the bottom of the fixture. The interface pins are electrically connected to circuit traces on the flex circuit 30 preferably by conducting flanges on the pins pressed in place to make contact with the circuit traces. The electrical test signals travel along the circuit traces 31 on the flex circuit and are communicated to corresponding barrels 22 in the support plate 16 which are electrically connected to the circuit traces by the physical connection from the press fit of the barrel in each bore 20. Close tolerancing between the barrels 22 and the outer diameter of the test probes 24 provides an electrical contact from the barrel to the test probe along the length of the barrel. The electrical test signals are then communicated to the circuit board through the tips 26 of the test probes 24. The electrical test signals then travel through the circuit traces of the circuit board 12 to other test points on the circuit board where they are then communicated to other test probes 24. In the reverse direction, the electrical test signals are communicated from the test probes 24 through the barrels 22 to the circuit traces on the flex circuit 30. The signals then travel along the passive circuit traces 31 of the flex circuit to corresponding interface pins 40 where they are communicated to the electronic test analyzer.

After testing is complete, the vacuum in the volume 50 is released and the pressure inside the air chamber 46 is decreased. As the gas pressure difference between the pressure inside the air chamber 46 and the volume 50 decreases, the board moves upwardly away from the test probes, and the diaphragm 42 will relax, thereby releasing the spring pressure against the circuit board.

FIG. 3 shows an alternative embodiment of the circuit board tester where rigid printed circuit boards are used as test signal translators in place of the flex circuit 30. In this embodiment, a rigid printed circuit board 60 is bonded to the bottom of the support plate 16. The printed circuit board is bonded to the support plate by suitable adhesives or other means of bonding the plastic board to the support plate. Circuit traces on the printed circuit board 60 are connected at one end to corresponding test probes 24. The other ends of the circuit traces are connected to corresponding probe terminals 62 in a probe interface area 64 at a peripheral region of the circuit board 60. The pins 62 can be in a grid pattern at the edge of the fixture. An array of interface probes 66 mounted in the side wall of the fixture housing 14 are spring-biased into contact with corresponding probe terminals 62. The top ends of the interface probes extend above the top surface of the fixture base and the bottom ends of the interface probes 62 extend beyond the bottom of the fixture base. A bottom printed circuit board 68 is affixed to the bottom of the fixture housing 14. Circuit traces on the bottom printed circuit board 68 connect the interface probes 66 to corresponding interface pins 70 located in a receiver 72 on the bottom of the fixture housing. The interface pins are electrically converted to corresponding circuit traces by conductive flanges mechanically pressed into contact with the circuit traces. The bottom circuit board can be a standard item in which the circuit traces are on a uniform pattern for connection to a uniform grid arrangement of the interface pins. In an alternative receiver arrangement the bottom circuit board 68 can be omitted and signals can be sent directly by the pins 62.

In a manner similar to that shown in the embodiment illustrated in FIG. 2, electrical test signals applied from the electronic test analyzer to the interface pins 70 are communicated to the circuit traces in the bottom printed circuit board 68. The electrical test signals travel along the traces to the interface probes 66 where they are then communicated to corresponding probe terminals 62 in the probe interface area 64 on the support plate 1. The signals are then communicated through the top printed circuit board 60 to the corresponding barrels 22 and test probes 24 which communicate the test signals to the test points on the circuit board 12. After traveling through the circuit traces in the circuit board 12 to other test points, the test signals are communicated to other test probes 24 and in the reverse direction along the board 60, to the probe terminals 62 and the interface probes 66, and to the bottom printed circuit board 68 which communicates them to the interface pins 70. The electronic test analyzer detects the test signals in the interface pins 70 for test analysis.

FIG. 4 illustrates an alternative configuration where an elastomeric bladder 80 is used instead of the air chamber formed by the air chamber housing and the elastomeric diaphragm. In this embodiment, the bladder 80 is a balloon-like, flexible, non-porous air inflatable enclosure which optionally can be connected to a supply of gas under pressure. The bladder is disposed within the fixture housing where it contacts the round heads 28 of the test probes 24 in a manner similar to that of the elastomeric diaphragm 42 of FIG. 2. The bladder 80 applies a spring-biased force against the test probes 24 when the volume 50 between the circuit board 12 and support plate 16 is evacuated and the board and test probes are forced down toward the bladder.

As an alternative to the embodiments shown in FIGS. 2, 3, and 4, the spring force from the diaphragm or bladder can be achieved by applying a positive fluid pressure to the interior of the bladder or to the air chamber to force the bladder or diaphragm positively against the probes to apply a controlled spring-biased force against the test probes 24, when the vacuum is drawn from the volume 50.

FIG. 5 illustrates an alternative configuration where the elastomeric diaphragm 42 is tautly extended across the round heads 28 of the test probes 24. The diaphragm 42 is disposed against the flex circuit 30 on the bottom surface of the test panel 16 and in contact with the round heads 28. The diaphragm is attached on one side to the support plate by a bolt 90 and a compression washer 92 between the head of the bolt and the diaphragm. The diaphragm is drawn tautly across the bottom surface of the support plate and is attached on the other side, to the support plate by a compression washer 92 and a bolt 90.

During electrical testing, the circuit board 12 is placed on the gasket 48 as described above for FIG. 1.

As a vacuum is drawn from the volume 50, the atmospheric pressure against the circuit board 12 compresses the board against the gasket 48 and draws the circuit board into contact with the test probes 24. The circuit board 12 is pushed against the tips 26 of the test probes 24, thereby pushing the round heads 28 of the test probes into the diaphragm 42. When the diaphragm is pushed, it deflects and stretches, producing a counter spring force against the test probes thereby pressing the test probes axially against the circuit board. The electrical test for this embodiment functions identically to that of the FIG. 2 embodiment described above.

The taut diaphragm disclosed in FIG. 5 for the flex circuit interconnection can easily be applied to the embodiment disclosed in FIG. 3. In this alternative embodiment, the diaphragm is tautly extended across the bottom of the printed circuit board 60 and attached by a washer 92 and a bolt 90. The diaphragm applies a spring force against the test probes as described for the flex circuit embodiment. Electrical testing for this embodiment is similar to that described for the FIG. 3 embodiment.

The fluid actuated fixture uses test probes without compression of electrical contact springs. The reduction in the complexity of the probes reduces the manufacturing cost of the fixture because the probes require fewer parts, and reliability is improved because there are fewer parts. Because the probes do not require springs, they can be spaced closer together thereby achieving the ability to test new technology circuit boards.

The spring force of the probes against the test points on the circuit boards is achieved by the fluid pressure within the bladder or diaphragm chamber and not by springs or compliant mats. Variations in the spring force are accomplished by varying the fluid pressure. Replacing springs or mats is unnecessary. The spring force against the test points or components on the circuit board is uniform and does not vary with displacement. Multiple uses of the fixture do not produce a "set" in the fixture as in fixtures using compliant mats. The ability to vary the spring force by varying fluid pressure allows the test probes to pierce contamination on the circuit board that prevents an electrical contact between the test probe and the test point without breaking mechanical contact or cycling the power to the circuit board. Time consuming wire wrapping of test probes and/or interface connections also is avoided. Use of the flex circuit as a means of translating test signals to the edge of the fixture has the advantage that flex circuits can be customized to the particular board under test in much shorter time than a standard rigid printed circuit card.

What is claimed is:

1. Apparatus for testing a circuit board having a plurality of spaced apart test points, the apparatus comprising:
    a rigid support plate disposed adjacent and substantially parallel to a circuit board for holding the board in a testing position;
    a plurality of elongated and spaced apart test probes each extending through respective bores in the support plate to support the probes in a pattern corresponding to that of the test points on the printed circuit board;
    means for supporting the circuit board and the support plate to be mutually spaced apart and substantially parallel, and so that a first end of each supported test probe is aligned for contact with a respective test point on the printed circuit board, and so that an opposite second end of each supported test probe faces away from the support plate and away from the circuit board;
    a flexible elastic diaphragm having a first face and a second face, the diaphragm mounted on the support plate so the first face of the diaphragm is normally held in contact with a side of the support plate opposite from the circuit board, the diaphragm thereby contacting the second ends of the test probes, and in which the second face of the diaphragm faces toward a void space into which the diaphragm is elastically movable away from the support plate in response to axial pressure contact from the second ends of the test probes; and
    means for moving the printed circuit board toward the support plate for forcing the printed circuit board into pressure contact with the test probes and thereby stretching the flexible diaphragm away from the support plate and holding the stretched diaphragm under tension and in spring-biased pressure contact with said second ends of the test probes in unison to resiliently force each test probe axially against a respective test point on the circuit board.

2. Apparatus for testing a circuit board having a plurality of spaced apart test points, the apparatus comprising:
    a housing having a cavity;
    a rigid support plate disposed in the housing adjacent and substantially parallel to the circuit board for holding the board in a testing position, the support plate having a gasket to engage the circuit board and form a pressure seal between the circuit board and the support plate;
    a plurality of elongated and spaced apart test probes each extending axially through a respective bore in the support plate to support the probes in a pattern corresponding to that of the test points on the printed circuit board;
    means for supporting the circuit board and the support plate to be mutually spaced apart and substantially parallel, and so that a first end of each probe is aligned for contact with a respective test point on the printed circuit board, and so that an opposite second end of each test probe faces away from the support plate and away from the circuit board;
    a thin, flexible fluid impervious elastic diaphragm mounted on the housing and over the cavity so that a first side of the diaphragm normally contacts the rigid support plate and said second ends of the test probes and so that a second side of the diaphragm faces the cavity, the diaphragm being elastically movable into said cavity and being normally held under tension against the support plate and the second ends of the test probes; and
    means for changing the fluid pressure difference on the opposite sides of the diaphragm to move the circuit board toward the test probes and thereby move the probes toward the diaphragm so the moving test probes urge the diaphragm into the cavity and into spring-biased pressure contact with the second ends of the probes in unison to resiliently force each probe axially against a respective test point on the circuit board.

3. The apparatus of claim 2, wherein the test probe comprises a conductive barrel in each bore, and the test probes comprise solid metal pins in contact with the barrels.

4. The apparatus of claim 2, further comprising means for applying a vacuum to the first side of the diaphragm to draw the circuit board toward and into contact with the test probes and to thereby stretch the diaphragm away from the support plate.

5. The apparatus according to claim 2, including a flex circuit bonded to the support plate and having circuit traces communicating with corresponding test probes, the circuit traces on the flex circuit extending away from the probes along the support plate and to a peripheral region of the fixture housing for transmitting test signals to an external circuit tester.

6. The apparatus according to claim 5, in which the test probes are solid metal pins.

7. The apparatus according to claim 2, including a translator board bonded to the support plate and having passive circuit traces communicating with corresponding test probes, the circuit traces on the translator board extending away from the probes for transmitting test signals to an external circuit tester.

8. Apparatus for testing a circuit board having a plurality of spaced apart test points, the apparatus comprising:
 means for holding the circuit board in a testing position;
 a plurality of separate test probes for contacting respective test points on the circuit board, the test probes having first ends and opposite second ends;
 a rigid support plate for supporting and holding the test probes in an array so that the first ends of the respective test probes are aligned with corresponding test points on the circuit board;
 a thin, flexible elastic diaphragm affixed to and overlying a side of the support plate opposite from the circuit board, the diaphragm being normally held under tension against the support plate and being movable under increased tension into an open space on a side of the diaphragm opposite from the test probes; and
 means for drawing the circuit board into contact with the first ends of the test probes to force the second ends of the test probes toward and into pressure contact with the diaphragm, the diaphragm being elastically movable into said open space from contact with the second ends of the test probes to hold the diaphragm in a stretched condition such that said increased tension within the stretched diaphragm applies an axial spring-biased force to the array of test probes in unison for making pressure contact with the test points on the circuit board.

9. Apparatus according to claim 8, in which the test probes comprise solid metal pins.

10. Apparatus according to claim 8, in which the diaphragm is movable by means for applying a vacuum to the underside of the circuit board, the diaphragm acting as an air-tight seal adjacent the side of the support plate opposite the probes, said vacuum causing a gas pressure differential that draws the board toward the probes to move the probes and thereby stretch the diaphragm.

11. Apparatus according to claim 10, including a thin insulating film having a plurality of electrically conductive circuits bonded to the support plate so that the circuits communicate with corresponding test probes, the circuits on the film extending away from the probes to a peripheral region of the fixture for transmitting test signals to an external circuit tester.

12. Apparatus according to claim 11 in which the test probes are solid metal pins.

13. Apparatus according to claim 12 in which the solid metal pins are movable in conductive barrels press fitted in the support plate and electrically connected to the circuits on the film.

14. Apparatus according to claim 8, in which the diaphragm comprises an elastic bladder having a surface contacting the second ends of the probes and urging the first ends of the probes to contact and apply a spring force to the respective test points on the circuit board when the bladder is in an inflated state, and for withdrawing the first ends of the probes from contacting the respective test points and releasing the spring force when the bladder is in a contracted state; and including means for expanding and contracting the bladder.

15. A test fixture for testing a circuit board having a plurality of spaced-apart test points, the test fixture comprising:
 a rigid support plate for supporting a printed circuit board under test;
 an array of elongated test probes supported within the support plate, the test probes having a normal at-rest position from which the probes are movable, the test probes having respective first ends aligned with the test points on the board under test, the probes having respective second ends facing away from a side of the support plate opposite from the board under test;
 a thin, flexible fluid impervious elastomeric diaphragm normally disposed under tension against a side of the support plate adjacent the second ends of the test probes, the diaphragm having a first face adjacent the second ends of the probes and a second face facing away from the probes, the tensioned diaphragm normally being substantially immovable in a direction toward the second ends of the test probes, the second ends of the probes being movable into contact with the first face of the diaphragm to elastically stretch the diaphragm away from the support plate;
 a cavity adjacent the second face of the diaphragm into which the diaphragm is elastically stretchable under forcible movement of the second ends of the test probes against the first face of the diaphragm; and
 means for applying a fluid pressure differential to the cavity so that the circuit board is drawn toward the first ends of the probes and into contact with the probes to move the second ends of the probes into the diaphragm to stretch the diaphragm, the stretched diaphragm having sufficient elasticity to apply a spring biasing force to the test probes in an axial direction in unison and against the test points on the board contacted by the test probes.

16. Apparatus according to claim 15, in which the probes are solid metal pins.

17. Apparatus according to claim 16, including an insulating sheet having printed circuit wiring, the sheet being bonded to the face of the support plate for transmitting test signals away from the test probes through the wiring to an external tester.

18. Apparatus for testing a circuit board having a plurality of spaced test points, the apparatus comprising:

a housing having a cavity;

a support plate disposed in the housing adjacent and substantially parallel to the circuit board for holding the board in a testing position;

a plurality of elongated and spaced apart solid metal test probes each extending through respective bores in the support plate in a pattern corresponding to that of the test points on the printed circuit board;

means for supporting the circuit board and the support plate to be mutually spaced apart and substantially parallel, and so that a first end of each probe contacts a respective test point on the printed circuit board, and so that an opposite second end of each test probe faces away from the support plate and away from the circuit board;

an electrically insulating sheet bonded to the support plate and having circuit traces communicating with corresponding test probes, a first group of circuit traces on the insulating sheet extending away from the probes for transmitting test signals to an external circuit tester and a second group of circuit traces on the insulating sheet extending to the probes for transmitting test signals from an external circuit tester;

a thin, flexible, elastic gas-impervious diaphragm mounted on the housing and over the cavity so that a first side of the diaphragm is normally held in contact with the rigid support plate and contacts said second ends of the test probes, and so that a second side of the diaphragm faces the cavity, the diaphragm being elastically movable into said cavity in response to axial pressure contact from the second ends of the test probes; and means for changing the gas pressure difference on the opposite sides of the diaphragm for moving the diaphragm into the cavity to an elastically stretched position spaced from the support plate in which increased tension in the stretched diaphragm urges the diaphragm into spring-biased pressure contact with the second ends of the probes in unison to resiliently force each probe axially against a respective test point on the circuit board.

19. The apparatus of claim 18, wherein the support plate has a separate conductive eyelet in each bore contacting the probe and in electrical contact with a corresponding circuit trace.

20. The apparatus according to claim 18 in which a vacuum is applied to the side of the diaphragm adjacent the circuit board to draw the circuit board into contact with the probes and move the probes into pressure contact with the diaphragm.

21. Apparatus for testing a circuit board having a plurality of spaced test points, the apparatus comprising:

a housing having a cavity;

means for holding the circuit board in a testing position adjacent the cavity;

a plurality of separate test probes comprising solid metal pins for contacting respective test points on the circuit board, the test probes having first ends and opposite second ends;

a rigid probe plate for arranging and holding the test probes in an array so that respective first ends of the test probes are aligned with corresponding test points on the circuit board;

a flexible circuit in sheet form bonded to the probe plate and having passive circuit traces communicating with corresponding test probes, the circuit traces on the flexible circuit sheet extending away from the probes for transmitting test signals to an external circuit tester;

an elastic diaphragm having a first side for contacting the second ends of the test probes, the first side of the diaphragm being normally held in contact with the rigid probe plate, the diaphragm having a second side which faces and closes the cavity and, when fluid pressure on the second side of the diaphragm is greater than fluid pressure on the first side of the diaphragm, the diaphragm expands elastically into the cavity to move away from the probe plate to a stretched position under tension so that the first ends of the test probes are in pressure contact with the respective test points on the circuit board in response to axial spring-biased pressure contact transmitted from the tensioned diaphragm to the second ends of the test probes; and means for adjusting the pressure difference across the two sides of the diaphragm.

22. Apparatus according to claim 21 including means for applying a vacuum to the side of the diaphragm opposite from the cavity to draw the circuit board toward the diaphragm and into pressure contact with the solid metal pins.

23. Apparatus according to claim 21 in which the housing includes an array of interface pins spaced from the test probes for contact with an external circuit tester, and in which the flexible circuit sheet wraps around the inside of the cavity continuously from the plane of the test probes to a plane in which the array of interface pins are mounted.

24. The apparatus of claim 1 wherein the diaphragm is held under tension.

25. The apparatus of claim 18 wherein the diaphragm normally contacts the rigid support plate and the second ends of the test probes under tension.

26. The apparatus of claim 21 wherein the diaphragm is normally held under tension.

* * * * *